(12) United States Patent
Lin

(10) Patent No.: US 8,867,297 B1
(45) Date of Patent: Oct. 21, 2014

(54) CHARGE/DISCHARGE CONTROL CIRCUIT AND CHARGE/DISCHARGE METHOD THEREOF

(71) Applicant: Transcend Information, Inc., Taipei (TW)

(72) Inventor: Chia-Pin Lin, New Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 0 days.

(21) Appl. No.: 13/938,254

(22) Filed: Jul. 10, 2013

(51) Int. Cl.
*G11C 7/00* (2006.01)
*G11C 5/14* (2006.01)

(52) U.S. Cl.
CPC .................................. *G11C 5/145* (2013.01)
USPC ........................... 365/226; 365/149; 365/204

(58) Field of Classification Search
USPC ........................ 365/226, 149, 204, 189.09
See application file for complete search history.

(56) References Cited

U.S. PATENT DOCUMENTS

| 6,980,047 | B1 | 12/2005 | Kuo |
| 7,539,042 | B2 * | 5/2009 | Tomita ........................ 365/149 |
| 8,067,931 | B2 | 11/2011 | Tran |

FOREIGN PATENT DOCUMENTS

TW          201117216          5/2011

* cited by examiner

*Primary Examiner* — David Lam
(74) *Attorney, Agent, or Firm* — Winston Hsu; Scott Margo

(57) ABSTRACT

A charge/discharge circuit is configured to directly charge a storage system using a power source under a power-on stage and to charge the storage system using power pre-stored in a capacitor under a power-off stage. With the aid of the charge/discharge circuit, an access speed of the storage system is prevented from being slowed down by attaching the large capacitance of the capacitor, and data accuracy of the storage system is prevented from being affected by sudden loss of power supply of the power source.

6 Claims, 8 Drawing Sheets

CHARGE/DISCHARGE CONTROL CIRCUIT AND CHARGE/DISCHARGE METHOD THEREOF

BACKGROUND

1. Technical Field

The present invention relates to a charge/discharge control circuit and a charge/discharge method thereof, and more particularly, to a charge/discharge circuit for a storage system and a charge/discharge method applied by the charge/discharge circuit.

2. Description of the Conventional Art

A conventional solid-state hard drive is characterized in its fast access speed. However, it may also suffer from accuracy issues while facing accidental power failures.

Please refer to FIG. 1, which illustrates how a conventional solid-state hard drive 110 is prevented from accuracy issues. As can be observed in FIG. 1, a capacitor 120 has a first terminal coupled to a power source 130 and the solid-state hard drive 110, and has a second terminal coupled to ground. While power failure suddenly occurs on the power source 130, the capacitor 120 is configured to provide preserved power to the solid-state hard drive 110 for emergently writing necessary data before the preserved power is run out, and data accuracy of the solid-state hard drive 110 can thus be maintained while suffering from an accidental power failure.

The remaining time for emergently writing the necessary data before running out of the preserved power can be raised by raising capacitance of the capacitor 120. However, under a normal operation of the power source 130 and the solid-state hard drive 110, the raised capacitance of the capacitor 120 may also lead to a longer access time of the solid-state hard drive 130, that is, the remaining time for emergently writing the necessary data while suffering an accidental power failure may be proportional to the access time of the solid-state hard drive 130 under the normal operation. It results in a slower access speed of the solid-state hard drive 110.

SUMMARY

The claimed invention discloses a charge/discharge control circuit. The charge/discharge circuit comprises a capacitor, a discharge circuit, and a switch module. The capacitor has a first terminal electrically coupled to ground. The discharge circuit has a first terminal electrically coupled to a second terminal of the capacitor, has a second terminal electrically coupled to ground, and has a third terminal electrically coupled to a power source and a storage system. The discharge circuit is configured to discharge a voltage level at the first terminal of the discharge circuit when a voltage level at the third terminal of the discharge circuit is lower than a threshold voltage level of the storage system. The switch module has a first terminal electrically coupled to the third terminal of the discharge circuit, and has a second terminal electrically coupled to the first terminal of the discharge circuit. The switch module is configured to allow only a first current to flow from the power source to the second terminal of the capacitor when a voltage level of the power source is higher than an activate voltage level of the storage system, and is configured to allow only a second current to flow from the second terminal of the capacitor to the storage system when the voltage level of the power source is lower than the activate voltage level of the storage system. The activate voltage level of the storage system is higher than the threshold voltage level of the storage system.

The claimed invention further discloses a charge/discharge method for a storage system. The charge/discharge method comprises: a switch module allowing only a first current to flow from a power source to a capacitor and charging the capacitor by the power source via the first current if a voltage level of the power source is higher than an activate voltage level of a storage system; the switch module allowing only a second current to flow from the capacitor to the storage system if the voltage level of the power source is lower than the activate voltage level of the storage system; and the discharge circuit discharging the capacitor when a voltage provided by the capacitor to charge the storage system is lower than a threshold voltage level of the storage system. The activate voltage level of the storage system is higher than the threshold voltage level of the storage system.

These and other objectives of the present invention will no doubt become obvious to those of ordinary skill in the art after reading the following detailed description of the preferred embodiment that is illustrated in the various figures and drawings.

DETAILED DESCRIPTION

For preserving the data accuracy of a storage system without lengthening the access time of the storage system while suffering from an accidental power failure, the present invention discloses a charge/discharge control circuit and a charge/discharge method applied on the charge/discharge control circuit for the storage system. In some embodiments of the present invention, the storage system is a solid-state hard drive.

Figure 1:
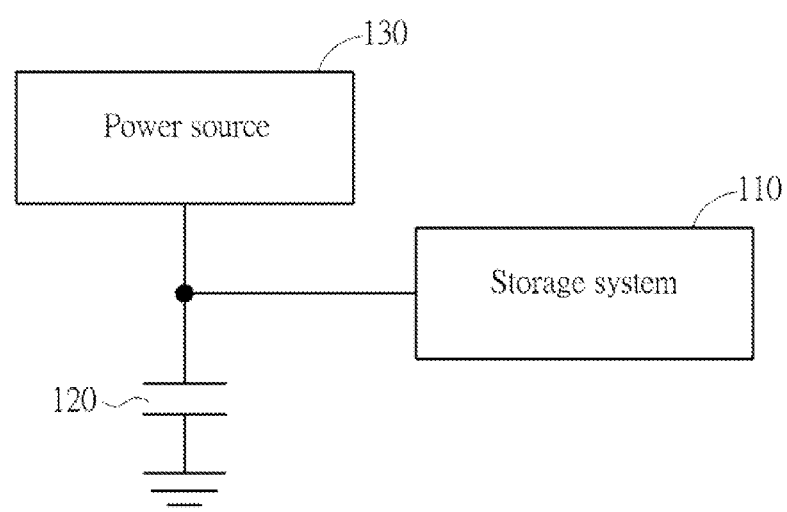
FIG. 1 illustrates how a conventional solid-state hard drive is prevented from accuracy issues.
Figure 2:
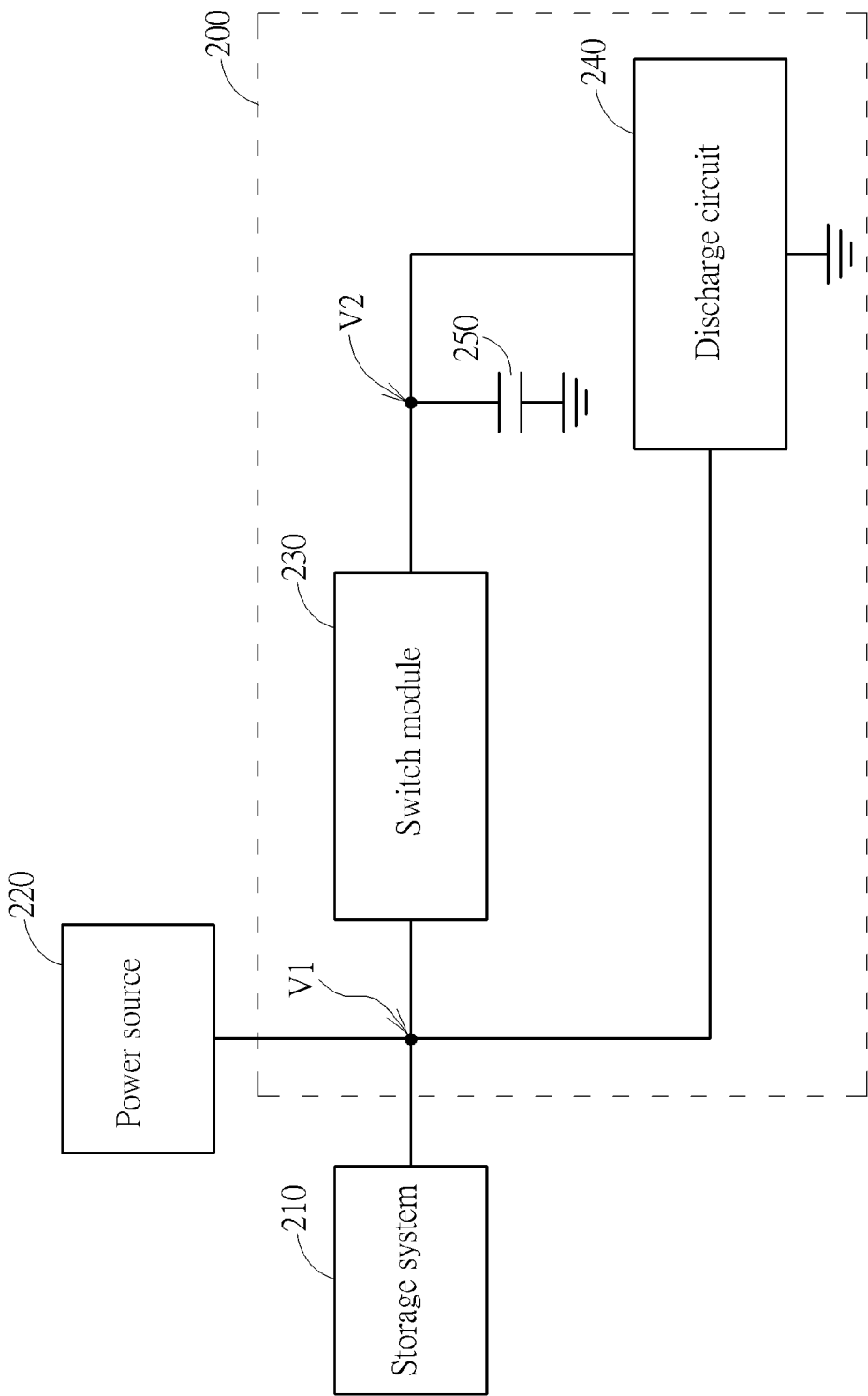
FIG. 2 is a diagram of a charge/discharge control circuit for a storage system according to one embodiment of the present invention.

Please refer to FIG. 2, which is a diagram of a charge/discharge control circuit 200 for a storage system 210 according to one embodiment of the present invention. As can be observed in FIG. 2, the charge/discharge control circuit 200 is electrically coupled to a power source 220 and a storage system 210, where the power source 220 is configured to supply power to the storage system 210. The charge/discharge control circuit 200 includes a switch module 230, a discharge circuit 240, and a capacitor 250.

The capacitor 250 has a first terminal electrically coupled to ground.

The discharge circuit 240 has a first terminal electrically coupled to a second terminal of the capacitor 250, has a second terminal electrically coupled to ground, and has a third terminal electrically coupled to the power source 220 and the storage system 210. Under an assumption that a voltage level supplied by the power source 220 is V1 and that a voltage level located at the first terminal of the discharge circuit 240 is V2, the discharge circuit 240 is configured to discharge the voltage level V2 when the voltage level V1 is lower than a threshold voltage level Vth of the storage system 210, where the threshold voltage level Vth indicates a lower bound of an operating voltage level for a data writing operation of the storage system 220. The discharge circuit 240 is also deactivated when the voltage level V1 is higher than the threshold voltage level Vth.

The switch module 230 has a first terminal electrically coupled to the third terminal of the discharge circuit 240 and a second terminal electrically coupled to the first terminal of the discharge circuit 240, that is, a voltage level at the second terminal of the switch module 250 is the voltage level V1. The switch module 230 is configured to allow only a first current to flow from the power source 220 to the second terminal of the capacitor 250, for example, by electrically connect the power source 220 to the second terminal of the capacitor 250, when the voltage level V1 is higher than or equal to an activate voltage level Von of the storage system 210. The switch module 230 is also configured to allow only a current to flow from the second terminal of the capacitor 250 to the second terminal of the switch module 230, i.e., to the storage system 210, when the voltage level V1 is lower than the activate voltage level Von. Note that the activate voltage level Von indicates a lower bound voltage level for any normal operation of the storage system 210, and the activate voltage level Von is higher than the threshold voltage level Vth.

Operations of the charge/discharge control circuit 200 are described in two stages including a power-on stage and a power-off stage.

(1) Power-On Stage

Figure 3:
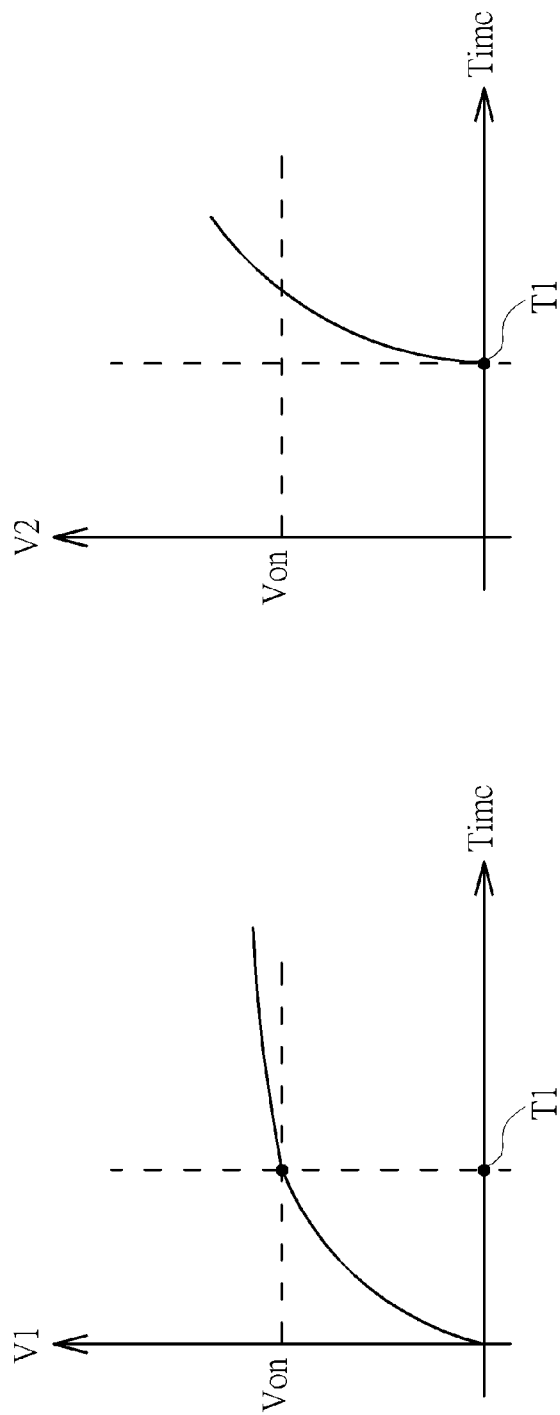
FIG. 3 illustrates waveforms of voltage levels V1 and V2 under a power-on stage of the charge/discharge control circuit shown in FIG. 2.

Please refer to FIG. 3, which illustrates waveforms of the voltage levels V1 and V2 under a power-on stage of the charge/discharge control circuit 200 shown in FIG. 2. As shown in FIGS. 2-3, when the storage system 210 is going to be activated, the voltage level V1 is raised. At a moment T1, the voltage level V1 is raised to be higher than or equal to the activate voltage level Von, and the switch module 230 is configured to allow only the first current to flow from the power source 220 to the second terminal of the capacitor 250 in response to the voltage level V1 currently higher than the activate voltage level Von. Therefore, the voltage level V2 is abruptly raised after reaching the moment T1 for charging the capacitor 250. Note that since the discharge circuit 240 is deactivated when the voltage level is higher than the threshold voltage Vth, which is lower than the activate voltage level Von, the discharge circuit 240 has been inactive before reaching the moment T1 and will be kept on being inactive after reaching the moment T1 as long as the voltage level V1 is kept to be higher than the activate voltage level Von.

As can be observed in the power-on stage, since the power source 220 is configured to supply power to the storage system 210, the access speed of the storage system 210 is not slowed down by the capacitance of the capacitor 250 in comparison to the prior art.

(2) Power-Off Stage

Figure 4:
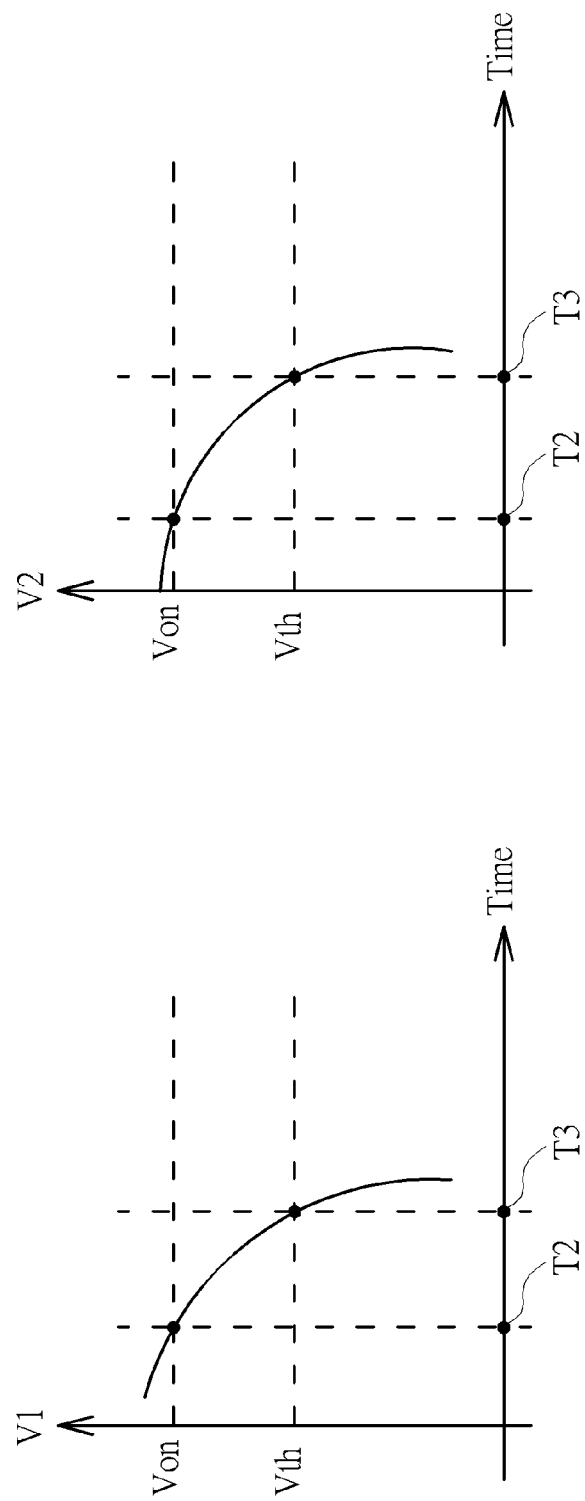
FIG. 4 illustrates waveforms of the voltage levels V1 and V2 under a power-off stage of the charge/discharge control circuit shown in FIG. 2.

Please refer to FIG. 4, which illustrates waveforms of the voltage levels V1 and V2 under a power-off stage of the charge/discharge control circuit 200 shown in FIG. 2. As shown in FIGS. 2 and 4, when the power source 220 suffers from an accidental power failure before a moment T2, the voltage level V1 may start falling below the activate voltage level Von at the moment T2; between the moment T2 and a moment T3 when the voltage level V1 falls at the threshold voltage level Vth, the switch module 230 is configured to allow only the second current to flow from the second terminal of the capacitor 250 to the second terminal of the switch module 230 for maintaining last and necessary writing operations of the storage system 210 before the storage system 210 completely loses its power supply, where the current comes from preserved power of the capacitor 250 pre-stored under the power-on stage. The voltage level V2 also falls from the activate voltage level Von at the moment T2 to the threshold voltage level Vth at the moment T3. As long as the capacitance of the capacitor 250 is large enough, the storage system 210 is capable of completing all necessary writing operations before reaching the moment T3.

After reaching the moment T3, for avoiding the abnormal behavior of the storage system 210 when the supplied voltage for the storage system 210, i.e., the voltage level V1, which is currently provided by the capacitor 250 to charge the storage system 250, is critically low, the voltage levels V1 and V2 are required to be discharged rapidly. Therefore, after the moment T3 when the voltage level V1 is dropped to the threshold voltage level Vth, the discharge circuit 240 is activated for discharging the voltage level V2 rapidly, so that the voltage level V1 is dropped rapidly in correspondence to the rapidly-dropped voltage level V2. Both the voltage levels V1 and V2 are optionally discharged to ground in some embodiments of the present invention.

As can be observed in the power-off stage, while the power source 220 suffers from an accidental power failure, with the aid of the charge/discharge control system 200 shown in FIG. 2, data accuracy of the storage system 210 can be saved by being immune from the suddenly-dropped voltage level V1 before reaching the moment T3 and by being immune from the remaining voltage level V1 after reaching the moment T3.

Figure 5:
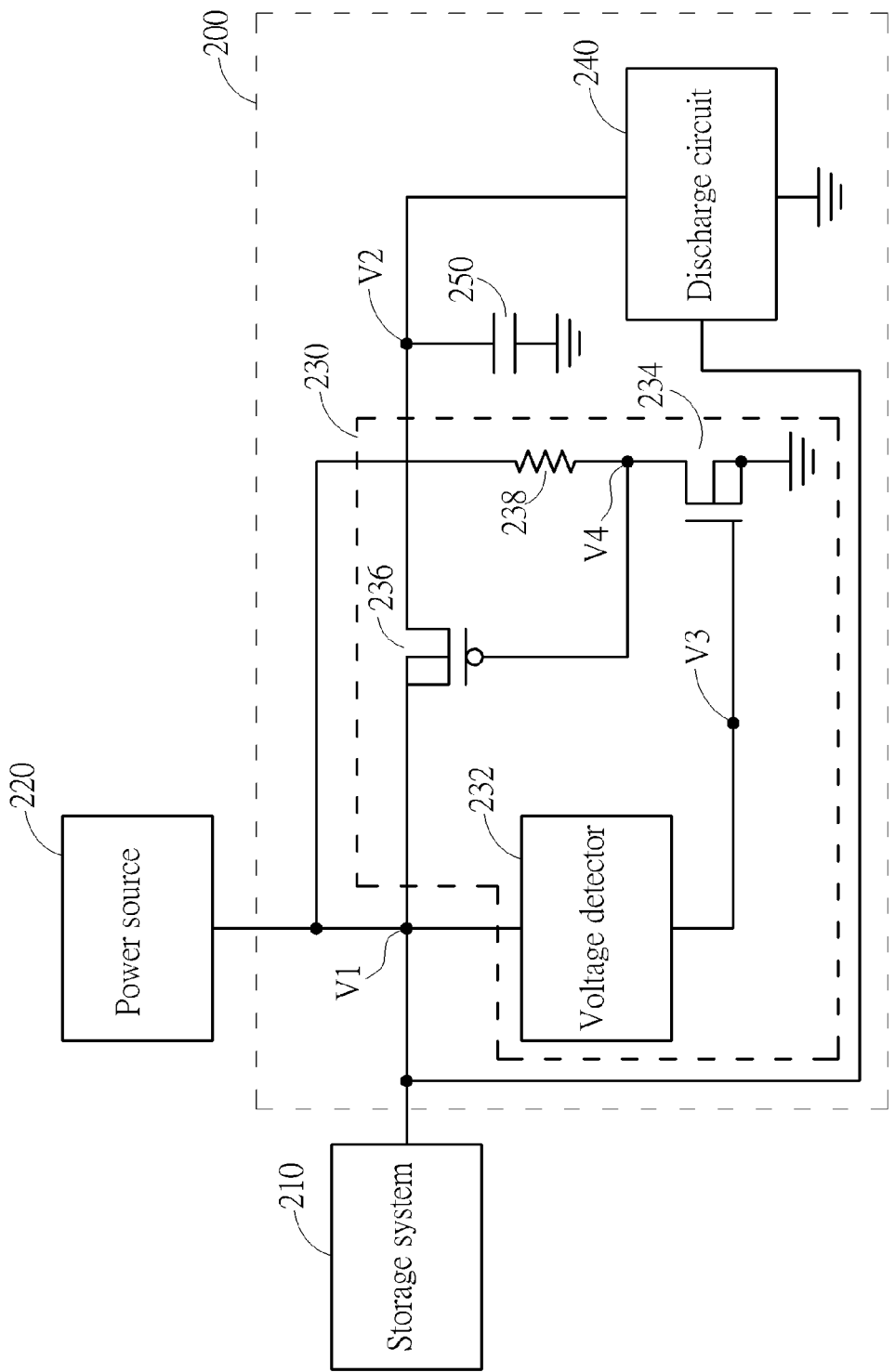
FIG. 5 illustrates a detailed diagram of the charge/discharge control circuit shown in FIG. 2 according to one embodiment of the present invention.

Please refer to FIG. 5, which illustrates a detailed diagram of the charge/discharge control circuit 200 shown in FIG. 2 according to one embodiment of the present invention. In FIG. 5, details of the switch module 230 are disclosed, however, by replacing the switch module 230 shown in FIG. 5 with other switch modules having same functions as functions of the switch module 230 shown in FIG. 2 should also be regarded as embodiments of the present invention.

As can be observed in FIG. 5, the switch module 230 includes a voltage detector 232, an N-type MOSFET 234, and a P-type MOSFET 236.

The voltage detector 232 has a first terminal electrically coupled to the first terminal of the switch module 230, i.e., to the power source 220 and the storage system 210, for detecting the voltage level V1.

The N-type MOSFET 234 has a gate electrically coupled to a second terminal of the voltage detector 234, has a source electrically coupled to ground, and has a drain electrically coupled to the power source 220 through the resistor 238.

The P-type MOSFET 236 has a gate electrically coupled to the drain of the N-type MOSFET 234, has a source electrically coupled to the first terminal of the switch module 230, i.e., to the storage system 210 and the power source 220, and has a drain electrically coupled to the second terminal of the switch module 230, i.e., to the second terminal of the capacitor 250.

The voltage detector 232 is configured to activate the N-type MOSFET 234 via the second terminal of the voltage detector 232, for example, by sending a logically-high signal to the gate of the N-type MOSFET 234, for activating the N-type MOSFET 234, when the voltage detector 232 confirms that the voltage level V1 is higher than or equal to the activate voltage level Von. The voltage detector 232 is also configured to deactivate the N-type MOSFET 234 via the second terminal of the voltage detector 232, for example, by sending a logically-low signal to the gate of the N-type MOSFET 234, for deactivating the N-type MOSFET 234, when the voltage level V1 is lower than the activate voltage level Von.

How the switch module 230 works under the power-on stage and the power-off stage of the charge/discharge control circuit 200 will be described in the following descriptions, where a voltage level at the gate of the N-type MOSFET 234 for activating/deactivating the N-type MOSFET 234 is assumed to be V3, and a voltage level at the drain of the N-type MOSFET 234 for controlling the P-type MOSFET 236 is assumed to be V4.

(1) Power-On Stage

Figure 6:
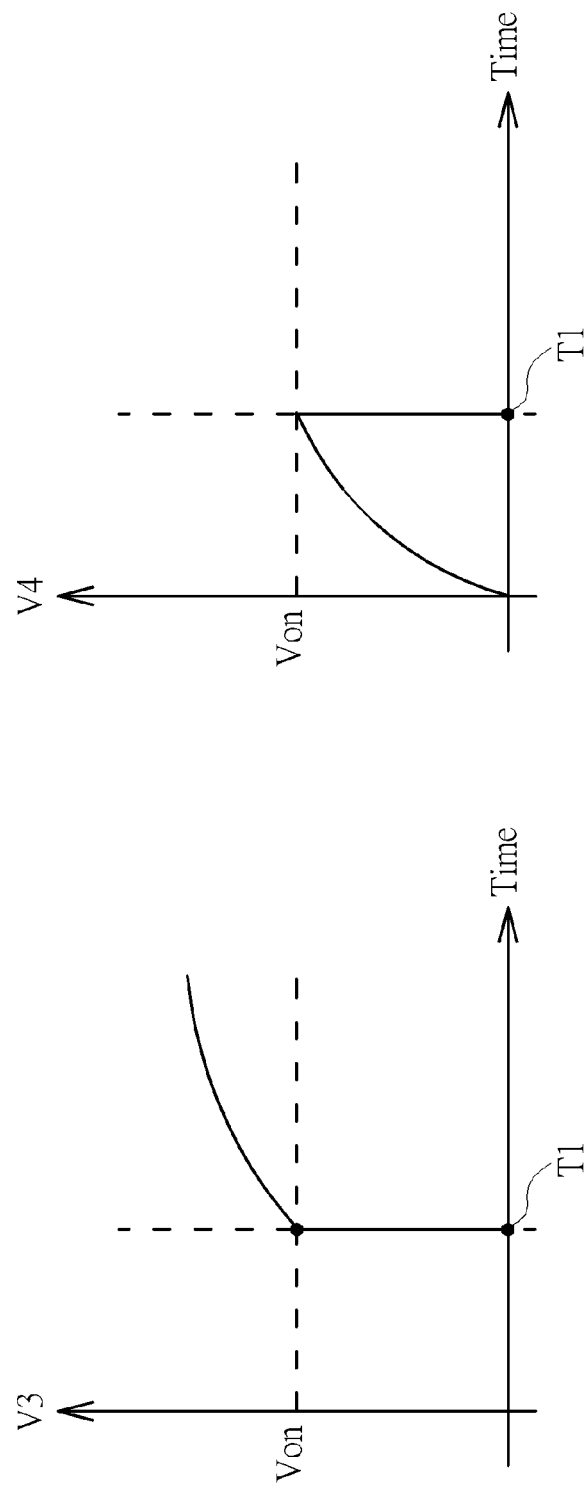
FIG. 6 illustrates waveforms of voltage levels V3 and V4 under the power-on stage of the charge/discharge control circuit shown in FIG. 5.

Please refer to FIG. 6, which illustrates waveforms of the voltage levels V3 and V4 under the power-on stage of the charge/discharge control circuit 200 shown in FIG. 5. As shown in FIGS. 3, 5 and 6, when the storage system 210 is going to be activated, the voltage level V1 is raised by the power source 220. At the moment T1, the voltage level V1 is raised to be higher than or equal to the activate voltage level Von, and the voltage detector 232 is configured to activate the N-type MOSFET 234 by sending a logically-high signal having a voltage level V3, which is located at the second terminal of the voltage detector 232 and is raised to be equal to or higher than a threshold voltage level Vth, to the gate of the N-type MOSFET 234 in response to the raised voltage level V1, as can be observed in the left part of FIG. 6, where the threshold voltage level Vth may be a threshold voltage level for the N-type MOSFET 234 and the P-type MOSFET 236 in the switch module 230 shown in FIG. 5 or for the storage system 210. After the N-type MOSFET 234 is activated, a voltage level V4 located at the drain of the N-type MOSFET 234 is discharged and lowered to be equal to or lower than the threshold voltage level Vth, for example, to a ground voltage level, so that the P-type MOSFET 236 is activated, as can be observed in the right part of FIG. 6. After the P-type MOSFET 236 is activated, the P-type MOSFET 236 only allows the first current flowing from its source to its drain so that the power source 220 is temporarily and electrically connected to the second terminal of the capacitor 250 for charging the capacitor 250 via the first current.

(2) Power-Off Stage

Figure 7:
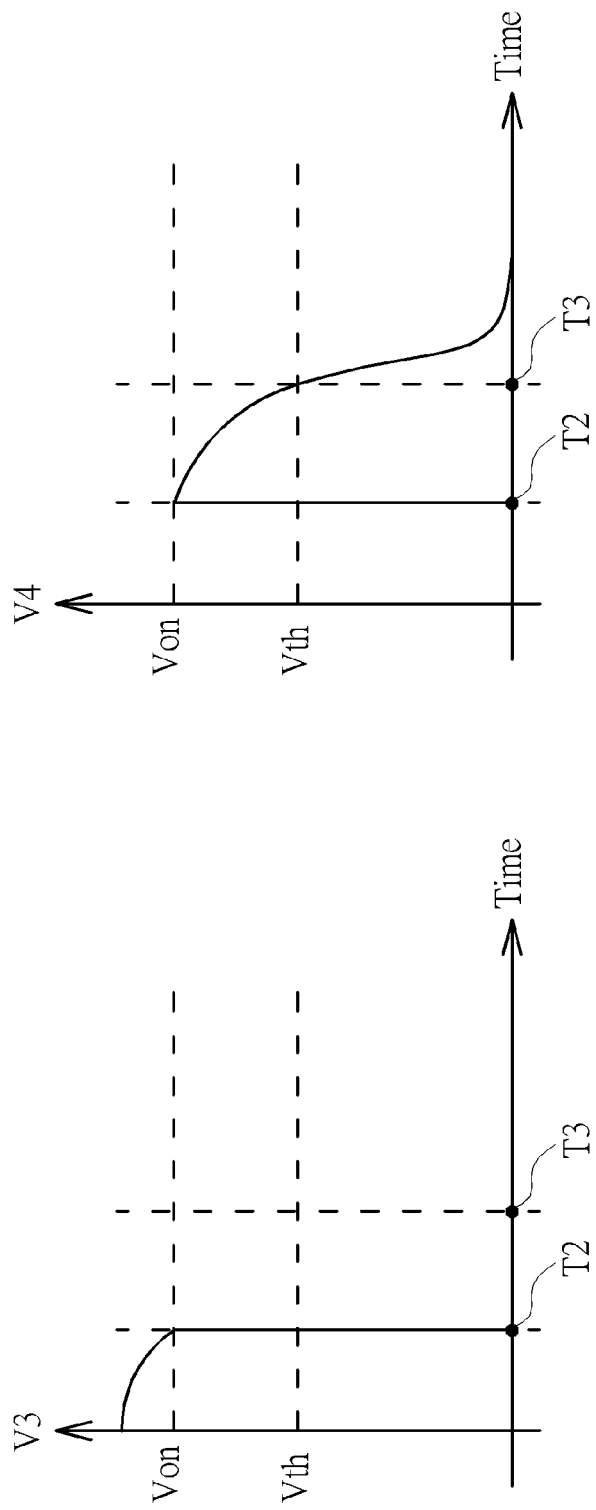
FIG. 7 illustrates waveforms of the voltage levels V3 and V4 under the power-off stage of the charge/discharge control circuit shown in FIG. 5.

Please refer to FIG. 7, which illustrates waveforms of the voltage levels V3 and V4 under the power-off stage of the charge/discharge control circuit shown in FIG. 5. As shown in FIGS. 4, 5 and 7, when the power source 220 suffers from an accidental power failure before the moment T2, the voltage level V1 may also start falling below the activate voltage level Von at the moment T2; between the moment T2 and a moment T3 when the voltage level V1 falls at the threshold voltage level Vth, the voltage detector 232 is configured to deactivate the N-type MOSFET 234 by sending a logically-low signal having the voltage level V3, which is higher than the voltage level Von before reaching the moment T2 and is lowered to be equal to a ground voltage level after reaching the moment T2, to the gate of the N-type MOSFET 234 for turning off the N-type MOSFET 234. Therefore, the voltage level V4 is raised abruptly from the ground voltage level to the activate voltage level Von at the moment T2 by the remaining and dropping power of the power source 220 via the resistor 238 and is kept on dropping; at this time, the P-type MOSFET 236 only allows the second current flowing from its drain to its source so that the capacitor 250 can be utilized for supplying its pre-stored power to the storage system 210 via the P-type MOSFET 236 between the moments T2 and T3, and data accuracy of the storage system 210 in writing between the moments T2 and T3 can be guaranteed as a result. After reaching the moment T3, the discharge circuit 240 is activated for discharging the voltage level V2 rapidly so that the voltage level V1, which is currently provided by the capacitor 250 to charge the storage system 250, is also discharged rapidly, and it prevents the remaining voltage of the voltage level V1 from disturbing the normal behavior of the storage system 210. On top of that, after reaching the moment T3, the voltage level V4 is still kept on dropping till reaching the ground voltage level.

Figure 8:
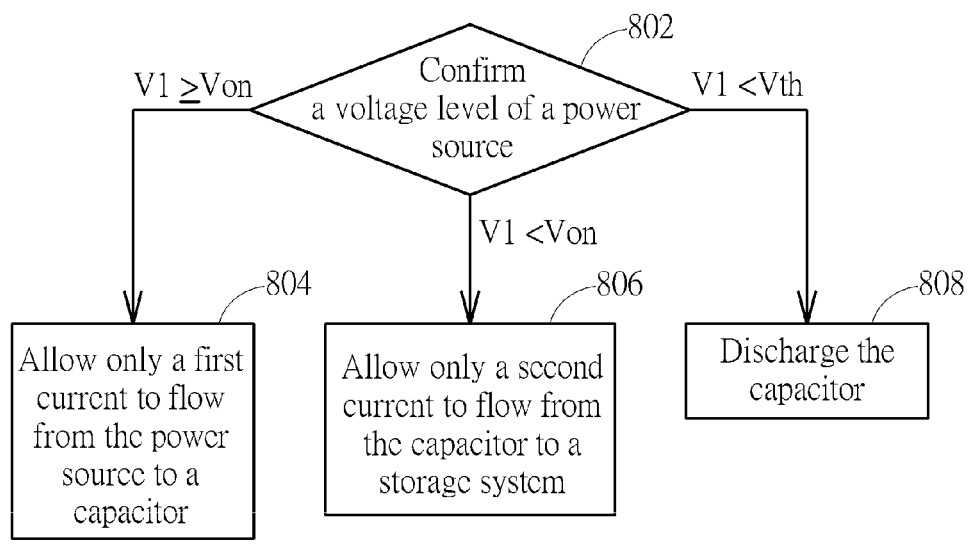
FIG. 8 illustrates a flowchart of a charge/discharge method according to one embodiment of the present invention.

Please refer to FIG. 8, which illustrates a flowchart of a charge/discharge method according to one embodiment of the present invention. As shown in FIG. 8, the charge/discharge method includes the following steps:

Step 802: Confirm the voltage level of the power source 220, i.e. the voltage level V1 shown in FIG. 2 and FIG. 5. When the voltage level of the power source 220 is higher than or equal to the activate voltage level Von of the storage system 210, go to Step 804; when the voltage level of the power source 220 is lower than the activate voltage level Von of the storage system 210, go to Step 806; and when the voltage level provided by the capacitor 250 is lower than the threshold voltage level Vth of the storage system 210, go to Step 808.

Step 804: Allow only a first current to flow from the power source 220 to the capacitor 250.

Step 806: Allow only a second current to flow from the capacitor 250 to the storage system 210.

Step 808: Discharge the capacitor 250.

Step 802 may be implemented by the switch module 230 shown in FIG. 2, the voltage detector 232 shown in FIG. 5 along with Step 804 and Step 806, or the discharge circuit 240 along with Step 808.

Note that the switch module 230 is capable of determining whether the voltage level V1 is higher or lower than the activate voltage level Von, and the discharge circuit 240 is capable of determining whether the voltage level V1 is higher or lower than the threshold voltage level Vth or Vth'.

Note that Step 804 may indicate enabling a connection between the power source 220 and the capacitor 250 by the switch module 230.

Embodiments formed by reasonable combination/permutation of steps shown in FIG. 8 and/or by adding any above-mentioned limitations are also regarded as embodiments of the present invention.

The present invention discloses a charge/discharge circuit for a storage system and a charge/discharge method applied on the charge/discharge circuit for preventing an access speed of the storage system from being slowed down by large capacitance of a capacitor and for preventing data accuracy of the storage system from being affected by sudden loss of power supply at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge/discharge control circuit, comprising:
a capacitor, having a first terminal electrically coupled to ground;
a discharge circuit, having a first terminal electrically coupled to a second terminal of the capacitor, having a second terminal electrically coupled to ground, and having a third terminal electrically coupled to a power source and a storage system, the discharge circuit configured to discharge a voltage level at the first terminal of the discharge circuit when a voltage level at the third terminal of the discharge circuit is lower than a threshold voltage level of the storage system; and a switch module, having a first terminal electrically coupled to the third terminal of the discharge circuit and having a second terminal electrically coupled to the first terminal of the discharge circuit, the switch module configured to electrically allow only a first current to flow from the power source to the second terminal of the capacitor when a voltage level of the power source is higher than an activate voltage level of the storage system and configured to allow only a second current to flow from the second terminal of the capacitor to the storage system when the voltage level of the power source is lower than the activate voltage level of the storage system;

wherein the activate voltage level of the storage system is higher than the threshold voltage level of the storage system.

2. The charge/discharge control circuit of claim 1, wherein the switch module comprises:

a voltage detector, having a first terminal electrically coupled to the first terminal of the switch module for detecting the voltage level of the power source;

an N-type MOSFET, having a gate electrically coupled to a second terminal of the voltage detector, having a source electrically coupled to ground, and having a drain electrically coupled to the power source; and an P-type MOSFET, having a gate electrically coupled to the drain of the N-type MOSFET, having a source electrically coupled to the first terminal of the switch module, and having a drain electrically coupled to the second terminal of the switch module;

wherein the voltage detector is configured to activate the N-type MOSFET via the second terminal of the voltage detector when the voltage level of the power source is higher than an activate voltage level of the storage system and is configured to deactivate the N-type MOSFET via the second terminal of the voltage detector when the voltage level of the power source is lower than the activate voltage level of the storage system.

3. The charge/discharge control circuit of claim 2, wherein the switch module further comprises:

a resistor, having a first terminal electrically coupled to the power source and a second terminal electrically coupled to the drain of the N-type MOSFET.

4. The charge/discharge control circuit of claim 1 wherein the storage system is a solid-state hard drive.

5. A charge/discharge method for a storage system, comprising:

allowing only a first current to flow from a power source and a capacitor and charging the capacitor by the power source via the first current if a voltage level of the power source is higher than an activate voltage level of a storage system;

allowing only a second current to flow from the capacitor to the storage system if the voltage level of the power source is lower than the activate voltage level of the storage system; and discharging the capacitor when a voltage provided by the capacitor to charge the storage system is lower than a threshold voltage level of the storage system;

wherein the activate voltage level of the storage system is higher than the threshold voltage level of the storage system.

6. The charge/discharge method of claim 5, further comprising:

using the switch module to determine whether the voltage level of the power source is higher or lower than the activate voltage level of the storage system.

* * * * *